United States Patent
Chilappagari et al.

(10) Patent No.: US 9,183,942 B2
(45) Date of Patent: *Nov. 10, 2015

(54) INTER-CELL INTERFERENCE CANCELLATION

(71) Applicant: Marvell World Trade LTD., St. Michael (BB)

(72) Inventors: Shashi Kiran Chilappagari, San Jose, CA (US); Zhengang Chen, San Jose, CA (US); Gregory Burd, San Jose, CA (US)

(73) Assignee: Marvell World Trade LTD., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 14/570,552

(22) Filed: Dec. 15, 2014

(65) Prior Publication Data

US 2015/0103594 A1    Apr. 16, 2015

Related U.S. Application Data

(63) Continuation of application No. 13/713,316, filed on Dec. 13, 2012, now Pat. No. 8,913,437.

(60) Provisional application No. 61/576,291, filed on Dec. 15, 2011.

(51) Int. Cl.
| | |
|---|---|
| *G11C 16/04* | (2006.01) |
| *G11C 16/26* | (2006.01) |
| *G11C 16/34* | (2006.01) |
| *G11C 11/56* | (2006.01) |

(52) U.S. Cl.
CPC ........ *G11C 16/3404* (2013.01); *G11C 11/5642* (2013.01); *G11C 16/26* (2013.01); *G11C 16/34* (2013.01); *G11C 16/3418* (2013.01); *G11C 16/3427* (2013.01); *G11C 16/04* (2013.01)

(58) Field of Classification Search
CPC ........... G11C 11/5642; G11C 16/3427; G11C 16/04; G11C 16/3418; G11C 16/26
USPC .......................... 365/185.02, 185.21, 185.24
See application file for complete search history.

(56) References Cited

U.S. PATENT DOCUMENTS

| | | |
|---|---|---|
| 7,848,152 B1 | 12/2010 | Huang et al. |
| 7,916,547 B2 | 3/2011 | Hosono |
| 8,392,809 B1 | 3/2013 | Varnica et al. |
| 8,456,905 B2 | 6/2013 | Kasorla et al. |
| 8,913,437 B2 * | 12/2014 | Chilappagari et al. ... 365/185.24 |
| 2010/0265764 A1 | 10/2010 | Yoo et al. |
| 2010/0329004 A1 | 12/2010 | Hemink |
| 2011/0305080 A1 | 12/2011 | Alrod et al. |
| 2013/0003454 A1 | 1/2013 | Edahiro et al. |

\* cited by examiner

*Primary Examiner* — Ly D Pham

(57) ABSTRACT

A read module reads memory cells along a first word line by applying a plurality of threshold voltages to the first word line; generates first information about a first memory cell located along the first word line and a first bit line indicating a location of a threshold voltage distribution of the first memory cell relative to the plurality of threshold voltages; reads a second memory cell located along the first word line, a second word line near the first word line, or a second bit line near the first bit line; and generates second information about the second memory cell indicating a state of the second memory cell causing interference to the first memory cell. A compensation module compensates for the interference by assigning one or more of a log-likelihood ratio and a hard decision to the first memory cells based on the first information and the second information.

16 Claims, 16 Drawing Sheets

| WL No. | Page A | Page B |
|---|---|---|
| 0 | 0 | 4 |
| 1 | 1 | 5 |
| 2 | 2 | 6 |
| 3 | 3 | 7 |
| 4 | 8 | 10 |
| 5 | 9 | 11 |
| 6 | 12 | 14 |
| 7 | 13 | 15 |
| ..... | ..... | ..... |

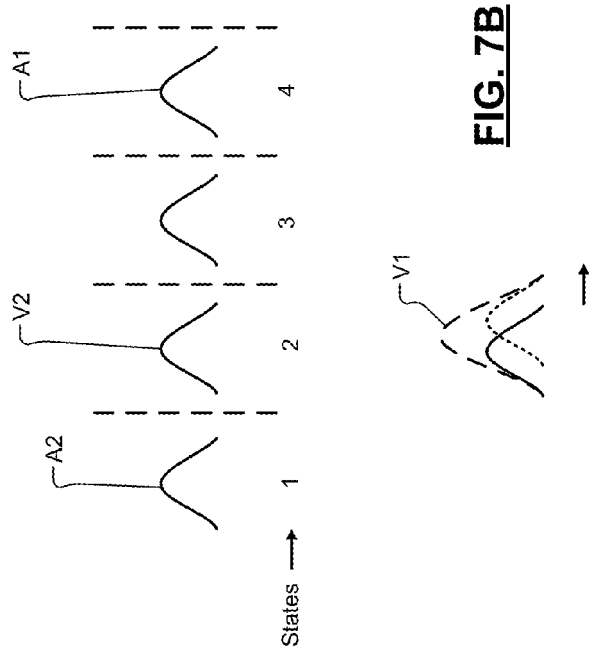
FIG. 7B
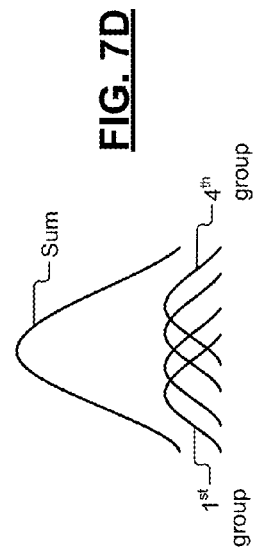
FIG. 7D
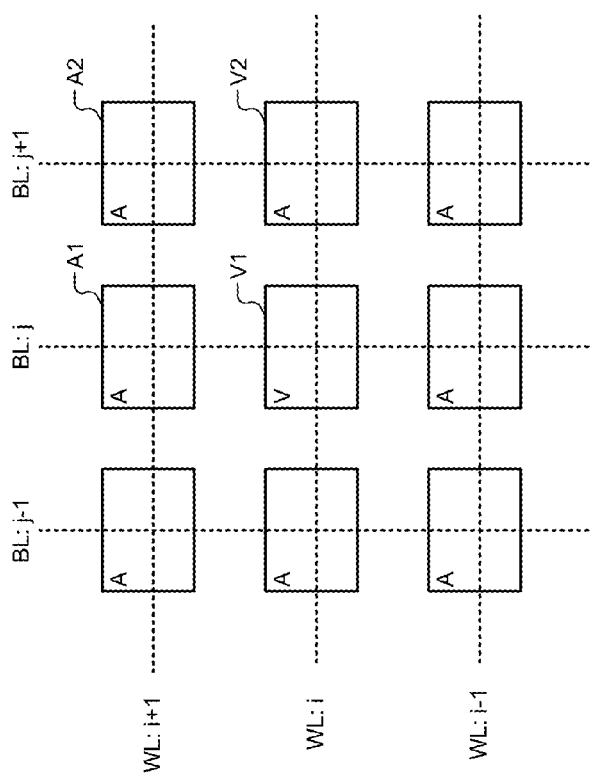
FIG. 7A
FIG. 7C

| 9876 | 76 |
|---|---|
| 0000 | 10 |
| 0001 | 01 |
| 0010 | 10 |
| 0011 | 10 |
| 0100 | 01 |
| 0101 | 00 |
| 0110 | 01 |
| 0111 | 01 |
| 1000 | 10 |
| 1001 | 01 |
| 1010 | 10 |
| 1011 | 10 |
| 1100 | 10 |
| 1101 | 01 |
| 1110 | 10 |
| 1111 | 10 |

FIG. 11

| 76 | 6 |
|----|---|
| 00 | 1 |
| 01 | 0 |
| 10 | 1 |
| 11 | 1 |

FIG. 12A

| 876 | 76 |
|-----|----|
| 000 | 01 |
| 001 | 10 |
| 010 | 00 |
| 011 | 01 |
| 100 | 01 |
| 101 | 10 |
| 110 | 01 |
| 111 | 10 |

FIG. 12B

INTER-CELL INTERFERENCE CANCELLATION

CROSS-REFERENCE TO RELATED APPLICATIONS

This application is a continuation of U.S. application Ser. No. 13/713,316 (now U.S. Pat. No. 8,913,437), filed on Dec. 13, 2012, which claims the benefit of U.S. Provisional Application No. 61/576,291, filed on Dec. 15, 2011. The entire disclosures of the applications referenced above are incorporated herein by reference.

FIELD

The present disclosure relates generally to semiconductor memory, and more particularly to interference cancellation in flash memory.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Memory integrated circuits (ICs) comprise memory arrays. The memory arrays include memory cells arranged in rows and columns. The memory cells may include cells of volatile or nonvolatile memory. Volatile memory loses data stored in the memory cells when power is removed from the memory cells. Nonvolatile memory retains data stored in the memory cells when power is removed from the memory cells.

The memory cells in the rows and columns of a memory array are addressed by word lines (WLs) that select the rows and bit lines (BLs) that select the columns. The memory ICs comprise WL and BL decoders that select the WLs and BLs, respectively, during read/write (R/W) and erase/program (EP) operations.

In FIG. 1, a memory IC 10 comprises a memory array 12, a WL decoder 16, a BL decoder 18, and a control module 19. The memory array 12 comprises memory cells 14 arranged in rows and columns as shown. The WL and BL decoders 16, 18 select the WLs and BLs, respectively, depending on the addresses of the memory cells 14 selected during R/W and EP operations.

The control module 19 receives commands (e.g., read, write, erase, program, etc.) from a host (not shown). The control module 19 reads and writes data in the selected memory cells 14. Additionally, the control module 19 erases and programs the selected memory cells 14 (e.g., in one or more blocks or pages) when the memory cells 14 include cells of nonvolatile memory such as flash memory.

For example only, the memory cells 14 may include cells of NAND or NOR flash memory. Each memory cell 14 may be programmed to store N binary digits (bits) of information, where N is an integer greater than or equal to 1. Accordingly, each memory cell 14 may have $2^N$ states. To store N bits per cell, each memory cell 14 may comprise a transistor having $2^N$ programmable threshold voltages (hereinafter threshold voltages). The $2^N$ threshold voltages of the transistor represent the $2^N$ states of the memory cell 14, respectively.

In FIG. 2, a memory cell 14-$i$ may comprise a transistor 50 having a threshold voltage $V_T$. The transistor 50 may comprise a floating gate G (hereinafter gate G), a source S, and a drain D. The amount of charge stored in the gate G during a write operation determines the value of threshold voltage $V_T$ and the state of the memory cell 14-$i$.

For example only, the transistor 50 may have two programmable threshold voltages $V_{T1}$ and $V_{T2}$ depending on the amount of charge stored in the gate G. When the amount of charge stored in the gate G is Q1, the threshold voltage of the transistor 50 is $V_{T1}$. When the amount of charge stored in the gate G is Q2, the threshold voltage of the transistor 50 is $V_{T2}$. Depending on the amount charge stored in the gate G, a gate voltage (i.e., $V_{GS}$) having a value greater than or equal to $V_{T1}$ or $V_{T2}$ may turn on the transistor 50 (i.e., generate a predetermined drain current).

The state of the memory cell 14 (i.e., data stored in the memory cell 14) is read by measuring the threshold voltage $V_T$ of the transistor 50. The threshold voltage $V_T$ cannot be read out directly. Instead, the threshold voltage $V_T$ is measured by applying the gate voltage to the gate G and sensing the drain current. The drain current is sensed by applying a small voltage across the source S and the drain D of the transistor 50.

When the gate voltage is less than the threshold voltage $V_T$, the transistor 50 is off, and the drain current is low (approximately zero). Conversely, when the gate voltage is greater than or equal to the threshold voltage $V_T$, the transistor 50 turns on, and the drain current becomes high (i.e., equal to the predetermined drain current corresponding to the $V_T$). The value of the gate voltage that generates the high drain current represents the threshold voltage $V_T$ of the transistor 50.

Typically, states of memory cells in a block or a page of a memory array are sensed at a time. The gates of the transistors of the memory cells in the block are connected to a WL. The WL is selected, and a voltage is applied to the WL. The states of N-bit memory cells are sensed by stepping through $(2^N-1)$ voltages on the WL and determining the threshold voltages of the transistors when the drain currents of the transistors first exceed a predetermined (preprogrammed) value.

In FIGS. 3A and 3B, the threshold voltage of the transistor 50 is measured as follows. For example only, the transistor 50 may have one of four threshold voltages $V_{T1}$ to $V_{T4}$, where $V_{T1}<V_{T2}<V_{T3}<V_{T4}$. Accordingly, the memory cell 14-$i$ may have one of four states 00, 01, 10, and 11.

In FIG. 3A, the control module 19 comprises a voltage generator 20 and current sensing amplifiers 22. The number of current sensing amplifiers is equal to the number of BLs. For example, when the IC 10 comprises B BLs, the current sensing amplifiers 22 include B current sensing amplifiers for B BLs, respectively, where B is an integer greater than 1.

In FIG. 3B, the WL decoder 16 selects a WL comprising memory cells 14-1, 14-2, ..., 14-$i$, ..., and 14-$n$ (collectively, memory cells 14) when the states of the memory cells are to be determined. Each of the memory cells 14 includes a transistor similar to the transistor 50. The transistors are shown as capacitances C that store the charge in the gates.

When a read operation begins, the voltage generator 20 supplies a voltage (e.g., a staircase voltage) to the WL decoder 16. The WL decoder 16 inputs the voltage to the selected WL. Accordingly, the voltage is applied to the gates of the transistors on the selected WL.

The current sensing amplifiers 22 include one current sensing amplifier for each BL. For example, a current sensing amplifier 22-$i$ communicates with a bit line BL-$i$ and senses the drain current that flows through the transistor 50 of the memory cell 14-$i$. The current sensing amplifier 22-$i$ senses the drain current by applying a small voltage across the source and the drain of the transistor 50.

Each current sensing amplifier senses the drain current through the respective one of the transistors of the memory cells 14. The control module 19 measures the threshold voltages of the transistors based on the drain currents sensed by the respective current sensing amplifiers 22.

SUMMARY

A system includes a read module configured to generate first information about a first memory cell located along a first bit line and a first word line of a memory array by reading memory cells along the first word line of the memory array. The memory cells include the first memory cell. The first information indicates a location of a threshold voltage distribution of the first memory cell relative to a plurality of threshold voltages applied to the first word line to read the memory cells. The read module is configured to generate second information about a second memory cell by reading the second memory cell. The second memory cell is located along (i) the first word line, (ii) a second word line that is adjacent to the first word line, or (iii) a second bit line that is adjacent to the first bit line. The second information indicates a state of the second memory cell causing interference to the first memory cell. The system further includes a compensation module configured to compensate for the interference caused by the state of the second memory cell based on (i) the first information and (ii) the second information.

In other features, the compensation module is configured to compensate for the interference using a log-likelihood ratio corresponding to (i) the first information and (ii) a distribution number corresponding to a threshold voltage distribution of the state of the second memory cell causing the interference to the first memory cell.

A system includes a read module configured to generate first information about a first memory cell located along a first bit line and a first word line of a memory array by reading memory cells along the first word line of the memory array. The memory cells include the first memory cell. The first information indicates a location of a threshold voltage distribution of the first memory cell relative to a plurality of threshold voltages applied to the first word line to read the memory cells. The system further includes a state determination module configured to determine states of one or more memory cells causing interference to the first memory cell. The one or more memory cells are located along (i) the first word line, (ii) a second word line that is adjacent to the first word line, or (iii) a second bit line that is adjacent to the first bit line. Locations of the one or more memory cells depend on a predetermined sequence of programming the memory cells.

In other features, the system further includes a mapping module configured to map one or more of the states causing similar interference to a distribution number. The distribution number represents threshold voltage distributions of the one or more of the states causing the interference to the first memory cell.

A system includes a selection module configured to select a first memory cell located along a first bit line and a first word line of a memory array, and select a second memory cell located along (i) the first word line, (ii) a second word line that is adjacent to the first word line, or (iii) a second bit line that is adjacent to the first bit line. A location of the second memory cell is selected based on a predetermined sequence of programming the memory cells. The system further includes a read-write module configured to write data in the first memory cell and subsequently in the second memory cell, and read the first memory cell and the second memory cell. The system further includes a detection module configured to detect one or more states of the second memory causing interference to the first memory cell.

In other features, the system further includes a read module configured to generate first information about the first memory cell by reading memory cells along the first word line of the memory array. The memory cells include the first memory cell. The first information indicates a location of a threshold voltage distribution of the first memory cell relative to a plurality of threshold voltages applied to the first word line to read the memory cells. The system further includes a state determination module configured to determine states of one or more memory cells causing interference to the first memory cell. The one or more memory cells include the second memory cell. The one or more memory cells are located along (i) the first word line, (ii) the second word line that is adjacent to the first word line, or (iii) the second bit line that is adjacent to the first bit line. Locations of the one or more memory cells are selected based on the predetermined sequence of programming the memory cells.

A method includes generating first information about a first memory cell located along a first bit line and a first word line of a memory array by reading memory cells along the first word line of the memory array. The memory cells include the first memory cell. The first information indicates a location of a threshold voltage distribution of the first memory cell relative to a plurality of threshold voltages applied to the first word line to read the memory cells. The method further includes generating second information about a second memory cell by reading the second memory cell. The second memory cell is located along (i) the first word line, (ii) a second word line that is adjacent to the first word line, or (iii) a second bit line that is adjacent to the first bit line. The second information indicates a state of the second memory cell causing interference to the first memory cell. The method further includes compensating for the interference caused by the state of the second memory cell based on (i) the first information and (ii) the second information.

In other features, the compensating for the interference includes using a log-likelihood ratio corresponding to (i) the first information and (ii) a distribution number corresponding to a threshold voltage distribution of the state of the second memory cell causing the interference to the first memory cell.

A method includes selecting a first memory cell located along a first bit line and a first word line of a memory array. The method further includes selecting a second memory cell located along (i) the first word line, (ii) a second word line that is adjacent to the first word line, or (iii) a second bit line that is adjacent to the first bit line. A location of the second memory cell is selected based on a predetermined sequence of programming the memory cells. The method further includes writing data in the first memory cell, subsequently writing data in the second memory cell, and reading the first memory cell and the second memory cell. The method further includes detecting one or more states of the second memory causing interference to the first memory cell.

In other features, the method further includes generating first information about the first memory cell by reading memory cells along the first word line of the memory array. The memory cells include the first memory cell. The first information indicates a location of a threshold voltage distribution of the first memory cell relative to a plurality of threshold voltages applied to the first word line to read the memory cells. The method further includes determining states of one or more memory cells causing interference to the first memory cell. The one or more memory cells include the second memory cell. The one or more memory cells are located along (i) the first word line, (ii) the second word line that is adjacent to the first word line, or (iii) the second bit line that is adjacent to the first bit line. Locations of the one or more memory cells are selected based on the predetermined sequence of programming the memory cells.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein:

FIG. 7A shows a victim cell and a plurality of aggressor cells in a memory array according to the present disclosure;

FIG. 7B shows effects of aggressor cells on a threshold voltage distribution of a victim cell according to the present disclosure;

FIG. 7C shows an overall threshold voltage distribution of victim cells when the victim cells are unaffected by aggressor cells according to the present disclosure;

FIG. 7D shows an overall threshold voltage distribution of victim cells when the victim cells are affected by aggressor cells according to the present disclosure;

FIG. 11 illustrates the difference between the amount of memory required to store aggressor state information before and after mapping the aggressor state information to distribution numbers according to the present disclosure;

FIGS. 12A and 12B illustrate the process of compressing the mapping information according to the present disclosure;

DESCRIPTION

Figure 2:
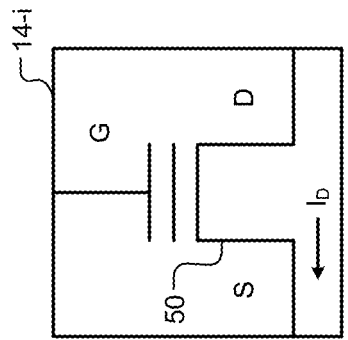
FIG. 2 is a schematic of a multi-level memory cell according to the prior art.
Figure 1:
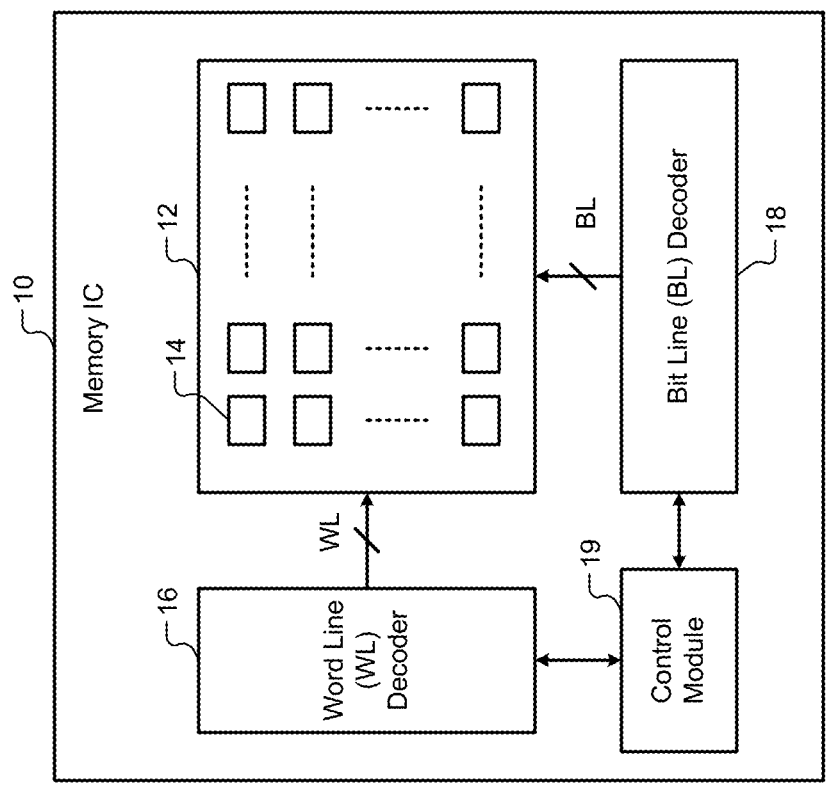
FIG. 1 is a functional block diagram of a memory integrated circuit (IC) according to the prior art.
Figure 3A:
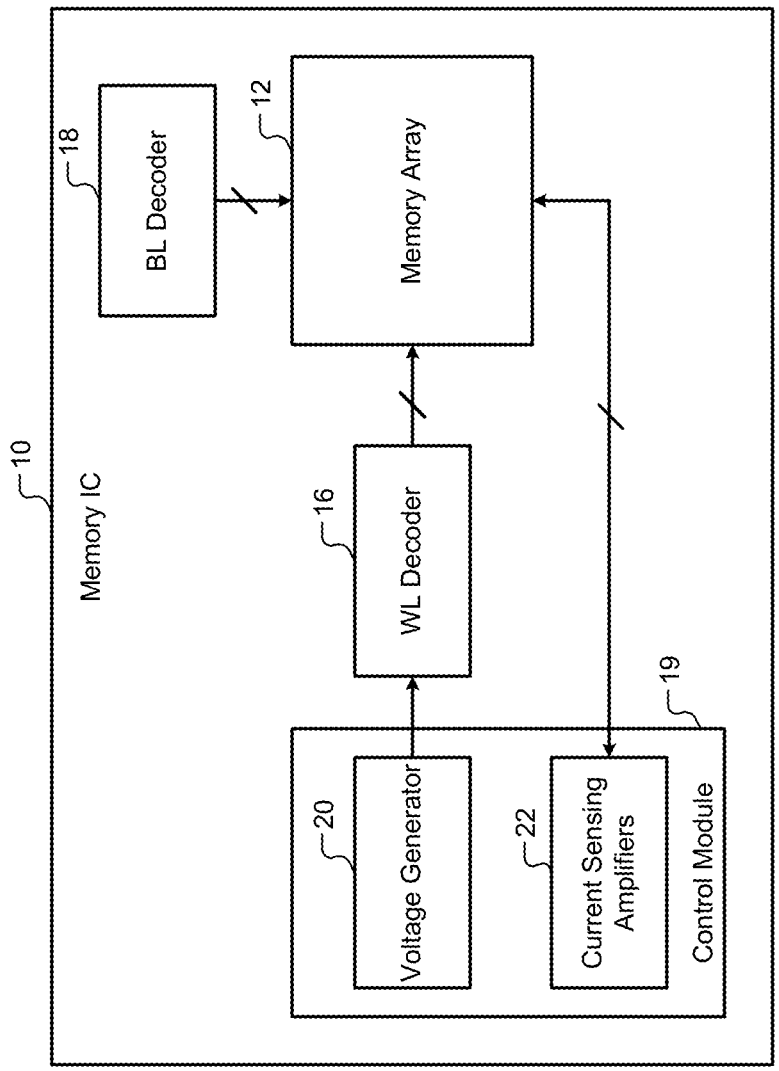
FIGS. 3A and 3B are functional block diagrams of the memory IC of FIG. 1 according to the prior art.
Figure 3B:
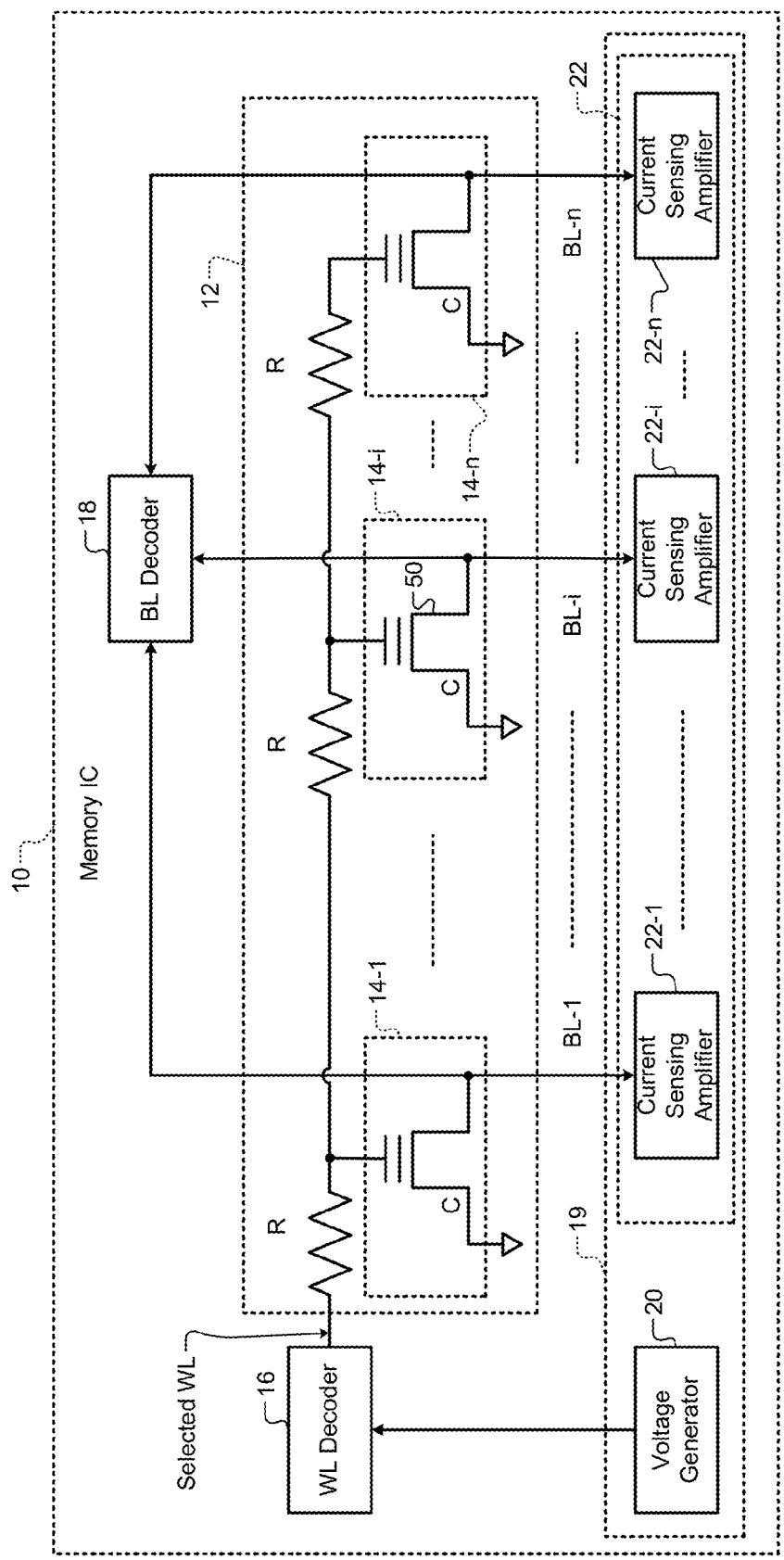

The present disclosure relates to canceling inter-cell interference in flash memory. In flash memory, when new data is written in memory cells along a word line, the newly written data affects data written earlier in memory cells along adjacent word lines. Accordingly, the data written earlier in memory cells along adjacent word lines experiences inter-cell interference from the newly written data.

The inter-cell interference is data dependent. That is, the inter-cell interference depends on a data pattern of the newly written data. To correct the effects of inter-cell interference on data stored in memory cells along a word line, the memory cells along the word line can be read repeatedly. Information obtained by repeatedly reading the memory cells along a word line is used to decode the data stored in the memory cells along the word line.

The present disclosure relates to canceling the effects of inter-cell interference on data stored in memory cells along a word line by reading the memory cells along the word line and also reading memory cells in adjacent word lines. Information obtained by reading memory cells in the adjacent word lines is used to compensate effects of inter-cell interference on data stored in memory cells along the word line. Accordingly, data stored in memory cells along a word line is decoded using information obtained by reading the memory cells along the word line and by reading the memory cells along adjacent word lines.

Before describing inter-cell interference and inter-cell interference cancellation in detail, threshold voltage distributions of flash memory cells are explained. Additionally, generating soft information including bin indexes and log-likelihood ratios for memory cells according to the present disclosure is explained. The soft information is used to cancel inter-cell interference as explained below.

In some memory systems such as flash memory systems, memory cells store data by trapping granulized amounts of charge in an isolated region of a transistor called a floating gate. Data stored in a memory cell (e.g., a transistor as explained below) is read by applying a voltage to the transistor and estimating the readout current, which is determined by the amount of charge trapped. When the applied voltage is greater than or equal to the threshold voltage of the transistor, which is determined by the amount of charge trapped, the transistor turns on, and the readout current is high.

Memory cells may store one or more bits per cell and may be called single-level or multi-level memory cells, respectively. A single-level memory cell may store one bit of information. For example only, the bit may be logic 0 when charge is stored in the memory cell or logic 1 when no charge is stored in the memory cell.

The multi-level memory cells may store more than one bit of information by storing varying amounts of charge or charge levels. For example, suppose Q is the maximum amount of charge that can be trapped in a multi-level memory cell. More than one bit of information can be stored in such a memory cell by storing a granulized amount of charge between 0 and Q. For example only, two bits of information may be stored in one multi-level memory cell by trapping any one of four levels of charges: 0, Q/3, 2Q/3, Q.

The process of trapping charge is called programming. The various levels of trapped charges translate into different threshold voltages for the memory cell. The data stored in the memory cell can be read by estimating the amount of charge stored in the memory cell. The amount of charge stored in the memory cell is estimated by applying a voltage and reading the current. When the current becomes high, the applied voltage is compared to one of the reference voltages. The reference voltages correspond to various states and corresponding threshold voltages of the memory cell, which depend on the amount of charge trapped in the memory cell.

Figure 4A:
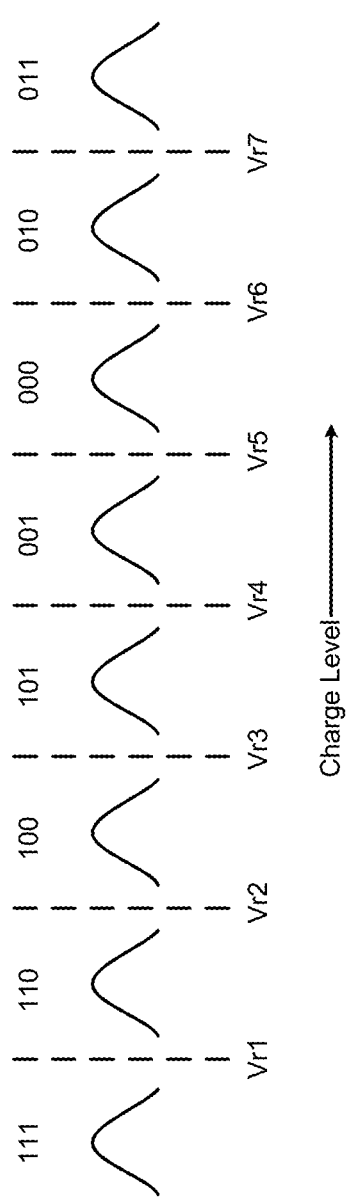
FIG. 4A depicts charge level distributions of a 3-bit memory cell according to the present disclosure.

In FIG. 4A, an example of a threshold voltage distribution for a 3-bit memory cell is shown. The 3-bit memory cell is used for example only. The discussion is applicable to any N-bit memory cell having $2^N$ nominal threshold voltages and ($2^N-1$) reference voltages, where N is an integer greater than 1.

The 3-bit memory cell can store up to eight different levels of charge, where each charge level corresponds to one of eight different states. Accordingly, the threshold voltage distribution of the memory cell includes eight different nominal threshold voltages. The eight nominal threshold voltages are associated with the eight levels of charge that can be stored in the memory cell, respectively. Although cells to be programmed to a desired state are programmed to a charge level corresponding to the desired state, the actual charge stored in the cell when the cell is programmed to the desired state can differ, and results in a distribution of the threshold voltage around the nominal threshold voltage. Accordingly, threshold voltages can have a distribution instead of a single value.

Intersections of adjacent charge levels define reference voltages that may be used to detect the data stored in the memory cell during read operations. Accordingly, the 3-bit memory cell has seven reference voltages ($V_{r1}$ through $V_{r7}$) that are located where adjacent distribution curves intersect.

The reference voltages should be known during a read operation to determine the level of charge and consequently the data stored in the memory cell. Initially, the reference voltages are set at the time of manufacture. Subsequently, during normal read operations, the threshold voltage of the memory cell is measured (by applying a voltage to the gate and measuring the drain current) and compared to the seven reference voltages to determine the data stored in the memory cell (i.e., the state of the memory cell).

For example only, when the threshold voltage is less than or equal to $V_{r1}$, the data stored in the memory cell is 111. When the threshold voltage is less than or equal to $V_{r2}$ and greater than $V_{r1}$, the data stored in the memory cell is 110, and so on. Finally, when the threshold voltage is greater than $V_{r7}$, the data stored in the memory cell is 011.

Figure 4B:
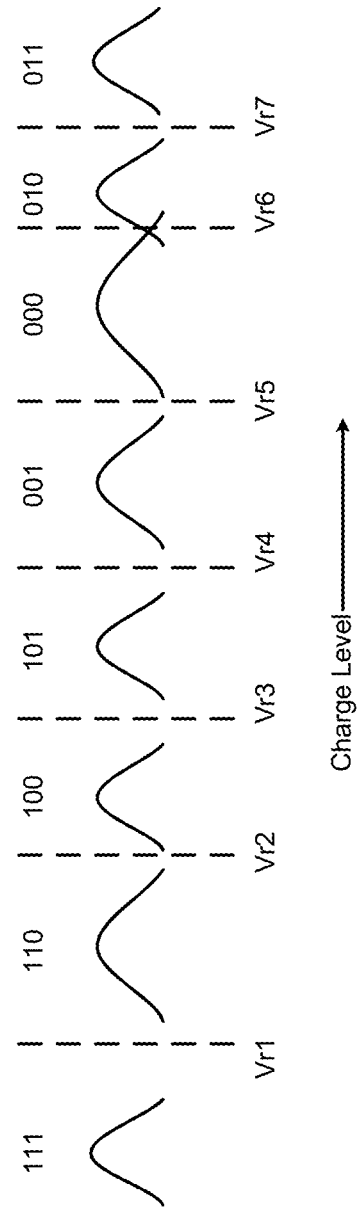
FIG. 4B depicts drifts in the charge level distributions of FIG. 4A due to cycling of the 3-bit memory cell according to the present disclosure.

In FIG. 4B, memory cells such as the multi-level flash memory cells may be subjected to charge retention loss after repeated read, write, erase, and/or program operations (collectively called cycling). For example, the oxide surrounding the floating gates of the memory cells may degenerate after repeated cycling. Consequently, the threshold voltage distributions may change or drift after cycling as shown. Accordingly, after cycling, data read using initial reference voltages from before cycling may be incorrect.

A read operation typically involves making a hard decision about the bits stored in memory cells. Consider a single-bit memory cell that can store either a 0 or a 1. Suppose the nominal threshold voltages corresponding to the stored values (i.e., states) 0 and 1 are $V_0$ and $V_1$, respectively. Without loss of generality, assume that $V_0 > V_1$. Since the single-bit memory cell can have two states 0 or 1, only one reference voltage $V_r$ set at the center of $V_0$ and $V_1$ is typically sufficient to detect the state of the single-bit memory cell.

The threshold voltages can vary over time due to usage, operating conditions (e.g., noise), and inter-cell interference (i.e., data currently being written in one cell affecting data previously written in a neighboring cell). If both the threshold voltages are subjected to similar noise conditions, the reference voltage $V_r$ can be set to the midpoint of $V_0$ and $V_1$ i.e., $V_r=0.5*(V_0+V_1)$. It can be shown that this setting of $V_r$ is optimal from a bit error rate (BER) perspective. The threshold voltage of the cell (i.e., the voltage at which drain current is high) is compared to $V_r$. If the threshold voltage is greater than $V_r$, the cell is read as 0, and read as 1 otherwise. This is known as hard decision since the result of the read operation is a hard decision regarding the state of the memory cell.

Generally, memory cells in one block or one page are read at a time. That is, a voltage is applied to the memory cells in a page, and the cells are read as storing 0 or 1 depending on whether the threshold voltages of the cells are greater or less than the reference voltage. When noise levels are high or the threshold voltage distribution of the cells shifts due to usage and inter-cell interference, the hard decisions can be incorrect if the reference voltage is not adjusted to account for the noise or the shift. Error-correcting decoders may be used to correct some errors. Not all the errors, however, may be corrected.

Errors can be reduced by performing more reads instead of performing a single read when determining a threshold voltage of a memory cell. Specifically, additional reads can be performed using additional reference voltages to determine the threshold voltage. By performing more reads, more information can be collected about the data stored in the cells. The additional information collected by performing the additional reads is called soft information, which can be used by the decoder to correct errors.

Figure 5:
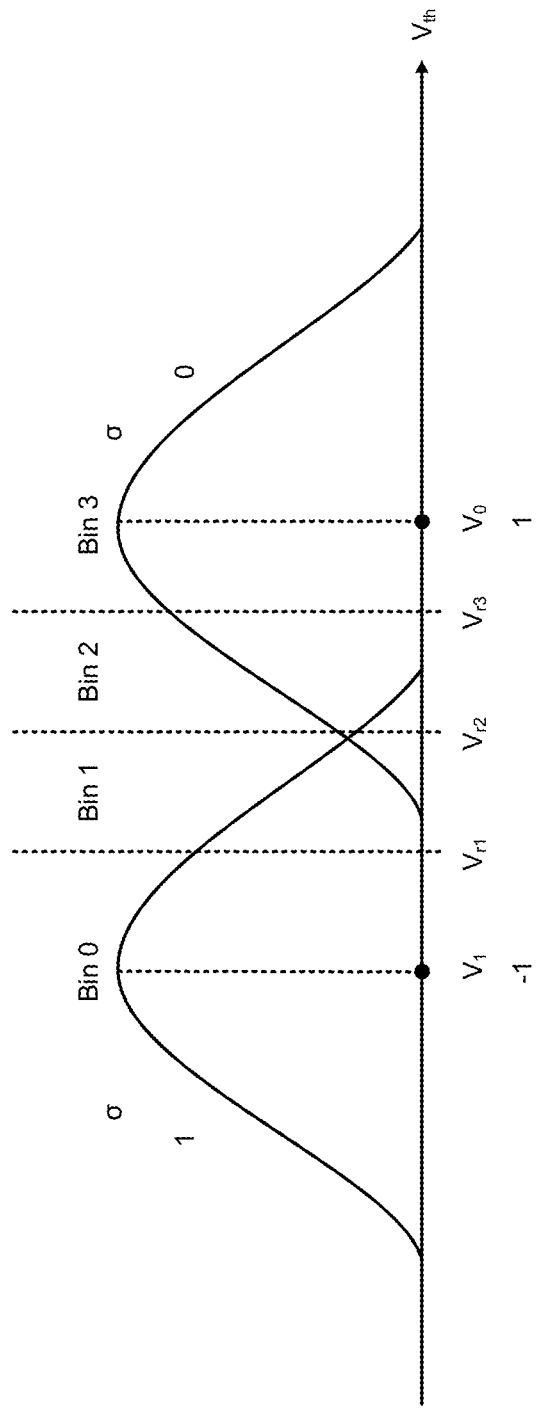
FIG. 5 depicts a threshold voltage distribution of a single-bit cell and reference voltages used to perform multiple read operations according to the present disclosure.

In FIG. 5, consider an example threshold voltage distribution of a single-bit cell that can store a 1 or a 0. The nominal voltage levels corresponding to the two states of the cell are denoted as −1 and 1, respectively. For example only, −1 and 1 may correspond to 1V and 4V, respectively. That is, in FIG. 5, $V_1$ and $V_0$ may be equal to 1V and 4V, respectively.

Assume that three reference voltages $V_{r1} < V_{r2} < V_{r3}$ are used in three read operations to determine the threshold voltage of the cell. That is, the voltage applied to the cell is compared to the three reference voltages to determine the threshold voltage of the cell. The three reference voltages partition the real line comprising the threshold voltage into four regions $R_1=(-\infty, V_{r1}]$, $R_2=(V_{r1}, V_{r2}]$, $R_3=(V_{r2}, V_{r3}]$ and $R_4=(V_{r3}, \infty)$. By performing three reads, the threshold voltage of the cell can be binned into one of the four regions or bins.

Cells having threshold voltages in bin 0 are more likely to have stored a −1, and cells having threshold voltages in bin 3 are more likely to have stored a 1. Cells having threshold voltages in bin 1 and bin 2, however, could have stored a −1 or a 1. The uncertainty about the states of the cells in bins 1 and 2 can be reduced by further increasing the number of reads. That is, the threshold voltage of a cell can be determined more accurately by increasing the number of reads. However, for practical purposes, the number of reads should be kept finite.

The concept of soft information is now explained. Suppose a threshold voltage of a cell is in bin 0. The probability P that the state of the cell is 1 (i.e., X=1) given that the threshold voltage read (i.e., Y) lies in bin 0 (i.e., Y ∈ bin 0) is expressed as P (X=1|Y ∈ bin 0). Similarly, the probability P that the state of the cell is −1 (i.e., X=−1) given that the threshold voltage read (i.e., Y) lies in bin 0 (i.e., Y ∈ bin 0) is expressed as P (X=−1|Y ∈ bin 0). If the threshold voltage of a cell is in bin 0, the probability P (X=−1|Y ∈ bin 0) is high relative to the probability P (X=1|Y ∈ bin 0).

These probabilities are computed for each cell, and log-likelihood ratios (LLRs) are calculated from these probabilities. Specifically, when a threshold voltage of a cell lies in one of the bins (i.e., when Y is known), a LLR can be computed to determine whether the actual threshold voltage (i.e., X) of the cell is 1 or −1. The LLR is expressed as log [P(X=1|Y)/P(X=−1|Y)]. P(X=1|Y) is the probability that the actual threshold voltage X of the cell is 1 given Y (i.e., with the threshold voltage read being in a given bin). P(X=−1|Y) is the probability that the actual threshold voltage X of the cell is −1 given Y (i.e., with the threshold voltage read being in a given bin). The sum of the probabilities P(X=1|Y) and P(X=−1|Y) is 1. That is, P(X=1|Y)+P(X=−1|Y)=1.

The LLR is positive if P(X=1|Y) is greater than P(X=−1|Y), and the LLR is negative if P(X=1|Y) is less than P(X=−1|Y). Accordingly, if the sign of LLR is positive, the actual threshold voltage of the cell is more likely to be 1, and if the sign of LLR is negative, the actual threshold voltage of the cell is more likely to be −1. The absolute value of the magnitude of the LLR indicates confidence in the result. Higher the absolute value of the magnitude, greater the confidence in the result. In other words, the sign of LLR indicates the hard decision, and the absolute value of the magnitude of the LLR indicates the reliability of the hard decision.

Thus, when a single read is performed to read a block of cells, the result is a stream of hard decisions 1's and −1's associated with the cells. On the other hand, when multiple reads are performed, the result is bin numbers associated with the cells. The states of the cells in right-most and left-most bins are 1's and −1's, respectively, with high reliability. Information about the states of the cells in the right-most and left-most bins is the soft information that can be used by the decoder in determining the states of the remaining cells whose states are uncertain.

The reference voltages for multiple reads can be set as follows. In general, the process of performing t reads can be interpreted as dividing a real line on which the threshold voltages lie into (t+1) regions and binning the threshold voltage of a cell to one of the regions. More generally, this process can be interpreted as a channel with two inputs (−1 and 1) and (t+1) outputs (i.e., the (t+1) regions or bins). For example, as shown in FIG. 5, by performing three reads, the threshold voltage of a cell can be binned into one of the four regions or bins.

When calculating reference voltages, probabilities and LLRs associated with each bin are also calculated. The LLRs are assigned to respective bins. Like the reference voltages, the LLR values can be symmetrical around the center of the threshold voltage distribution. For example, the LLR value for bin 0 can be the same as the LLR value for bin 3 except for the change of sign. Similarly, the LLR value for bin 1 can be the same as the LLR value for bin 2 except for the change of sign, and so on.

Currently, LLRs are assigned based on a bin index. A bin index of a memory cell indicates a location of threshold voltage distribution of the memory cell. The location is relative to reference voltages used to read the memory cell. Memory cells having the same bin index are assigned the same LLR. To compensate for inter-cell interference, however, states of neighboring cells also need to be considered. Two cells with the same bin index can have different LLRs if neighboring cells of the two cells have different states.

Figures 6A, 6B:
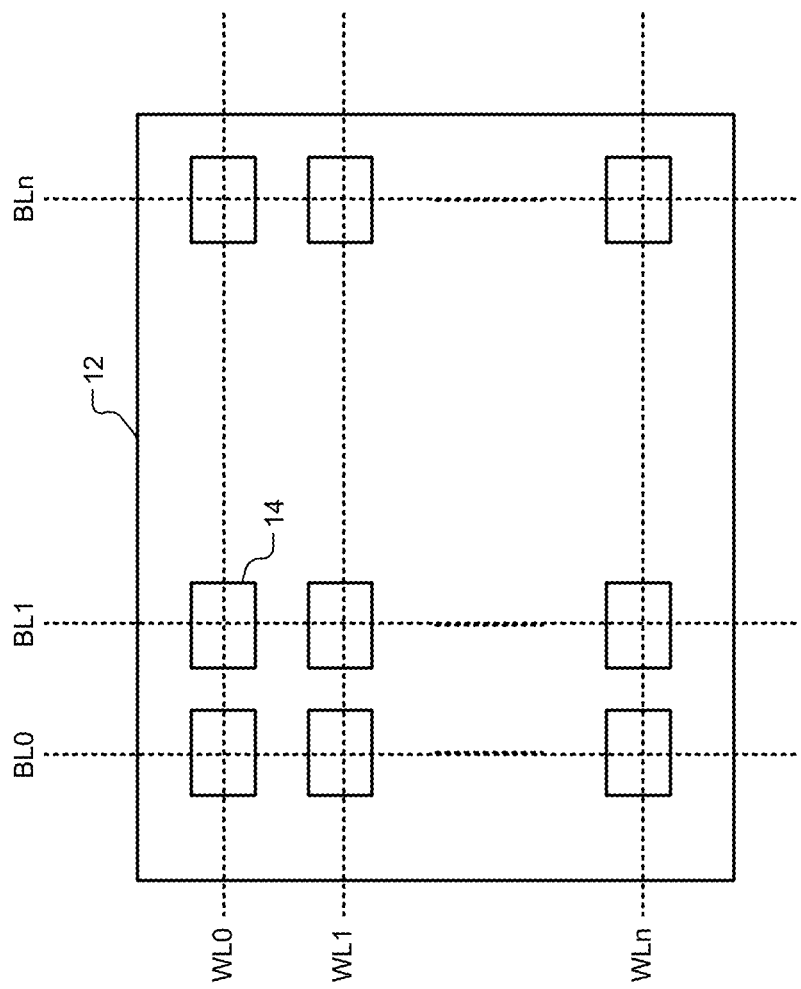
FIG. 6A depicts a memory array according to the present disclosure.
FIG. 6B shows a table for programming pages in the memory array of FIG. 6A according to the present disclosure.

In FIGS. 6A and 6B, the memory array 12 includes the memory cells 14 located along word lines WL0, WL1, . . . , WLn, and bit lines BL0, BL1, . . . , BLn as shown, where n is an integer greater than 1. Suppose, for example only, that the memory cells 14 store 2-bits per cell. Data is stored in the memory cells 14 in pages. Since the memory cells 14 store 2-bits per cell, each word line will be associated with 2 pages: a first page (e.g., page A) where a first bit of the 2-bits of each memory cell along a word line is stored; and a second page (e.g., page B) where a second bit of the two bits of each memory cell along the word line is stored.

The pages are generally programmed in a predetermined order. Manufacturers optimize the order of programming pages to minimize inter-cell interference. For example, the order may be as shown in FIG. 6B: pages 0, 1, 2, and 3 may be along word lines 0, 1, 2, and 3, respectively; pages 4, 5, 6, and 7 may be along word lines 0, 1, 2, and 3, respectively; pages 8 and 9 may be respectively along word lines 4 and 5; pages 10 and 11 may be respectively along word lines 4 and 5; and so on.

The pages are programmed in the following order: word line 0 is programmed to program page 0; word line 1 is programmed to program page 1; word line 2 is programmed to program page 2; word line 3 is programmed to program page 3; then word line 0 is programmed to program page 4; word line 1 is programmed to program page 5; and so on.

Accordingly, pages 0 and 4, instead of pages 0 and 1, will be along the word line 0. Instead, if pages 0 and 1 were along the word line 0, and if pages 2 and 3 were along the word line 1, pages 0 and 1 will be programmed first, followed by pages 2 and 3. Programming pages 2 and 3 after having programmed pages 0 and 1, however, will affect the data written in pages 0 and 1. Instead, if pages are programmed as shown in FIG. 6B, effect of data already written on page 1 along word line 1 can be taken into account while writing page 4 on word line 0.

Although the manufacturers optimize the order to minimize inter-cell interference, some inter-cell interference may still persist. The manufacturer's order is fixed for a device type. For example, a 3-bits-per-cell memory integrated circuit manufactured using 19 nanometer process may have a fixed programming order optimized for that device. Based on the manufacturer's order, the inter-cell interference in the device may follow a pattern. The pattern can be recognized and compensated.

Compensation data can be generated for the device after the device is manufactured and before a user begins using the device to store data. The compensation data can be added to the device before a user begins using the device to store data. The compensation data can be used to compensate inter-cell interference throughout the useful life of the device.

FIGS. 7A-7D are used to explain inter-cell interference. In FIG. 7A, when data is written to a $j^{th}$ cell in an $i^{th}$ word line (i.e., a cell at an intersection of $j^{th}$ word line and $i^{th}$ bit line), the data is affected by data previously written in one or more neighboring cells. The $j^{th}$ cell in the $i^{th}$ word line that is affected by the neighboring cells is called a victim cell (V). The neighboring cells that affect the victim cell are called aggressor cells (A).

The aggressor cells affect the victim cell due to a coupling between the aggressor cells and the victim cell. The aggressor cells are located adjacent to the victim cell. For example, an aggressor cell can be located in word lines j+1 and/or j−1 adjacent to the word line j in which the victim cell is located. The aggressor cell can also be located in bit lines i−1 and/or i+1 adjacent to the bit line i in which the victim cell is located.

In FIG. 7B, the threshold voltage distribution of a victim cell is a function of the state of one or more aggressor cells. For example only, assume that the cells can store 2-bits-per-cell (i.e., each of the cells can have one of four possible states). Suppose that two victim cells V1 and V2 are affected by two aggressor cells A1 and A2. Suppose, for example only, that the aggressor cell A1 is charged to the highest state (state 4) and that the aggressor cell A2 is charged to the lowest state (state 1). Suppose further, for example only, that the victim cells V1 and V2 are programmed to the second state.

Since the aggressor cell A2 is programmed to the lowest state, the state of the aggressor cell A2 may not interfere with the state of the victim cell V2. Consequently, the threshold voltage distribution of the victim cell V2 will appear normal as shown. Since the aggressor cell A1 is programmed to the highest state, the state of the aggressor cell A1 may interfere with the state of the victim cell V1. Consequently, the threshold voltage distribution of the victim cell V1 may shift to the right as shown. Accordingly, when the victim cells V1 and V2 are read, without knowing the state of the aggressor cells A1 and A2, the threshold voltage distribution of the victim cells V1 and V2 will appear as a single distribution, which in fact is a sum of the normal distribution and the shifted distribution as shown.

Now suppose that N cells along a word line are programmed to the second state. Each of the N cells will have a neighboring cell. Each of the neighboring cells can have one of four possible states. Accordingly, the N cells can be divided into four groups. A first group of N/4 cells can have neighboring cells programmed to state 1. A second group of N/4 cells can have neighboring cells programmed to state 2. A third group of N/4 cells can have neighboring cells programmed to state 3. A fourth group of N/4 cells can have neighboring cells programmed to state 4.

In FIG. 7C, if the neighboring cells are programmed to state 1, the neighboring cells will have no impact on the threshold voltage distribution of the N cells. Therefore, the threshold voltage distribution of the cells in each of the four groups will appear as normal. The overall threshold voltage distribution of the N cells will be a sum of the distributions of the four groups as shown.

In FIG. 7D, if the neighboring cells are programmed to states 1 through 4, however, the neighboring cells will impact the threshold voltage distribution of the N cells as shown. Therefore, the threshold voltage distribution of the cells in each of the four groups will appear shifted as shown. The overall threshold voltage distribution of the N cells will be a sum of the distributions of the four groups as shown. The threshold voltage distribution of the N/4 cells in the fourth group may have in fact shifted by nearly one state, which will not be detectable by simply detecting the overall distribution unless the states of the neighboring states are taken into consideration.

Therefore, to compensate for inter-cell interference, instead of assigning the same LLR to two cells having the same bin index, a different LLR can be assigned to each cell if the neighboring cell of each cell has a different state. For example, if two victim cells V1 and V2 have the same state (e.g., state 2), and if their respective aggressor cells A1 and A2 have different states (e.g., A1 has state 4, and A2 has state 1), V1 can be assigned a different LLR than V2 to distinguish the threshold voltage distribution of V1 from that of V2 although the overall distribution (and hence the bin index) of V1 and V2 is the same.

Figure 8:
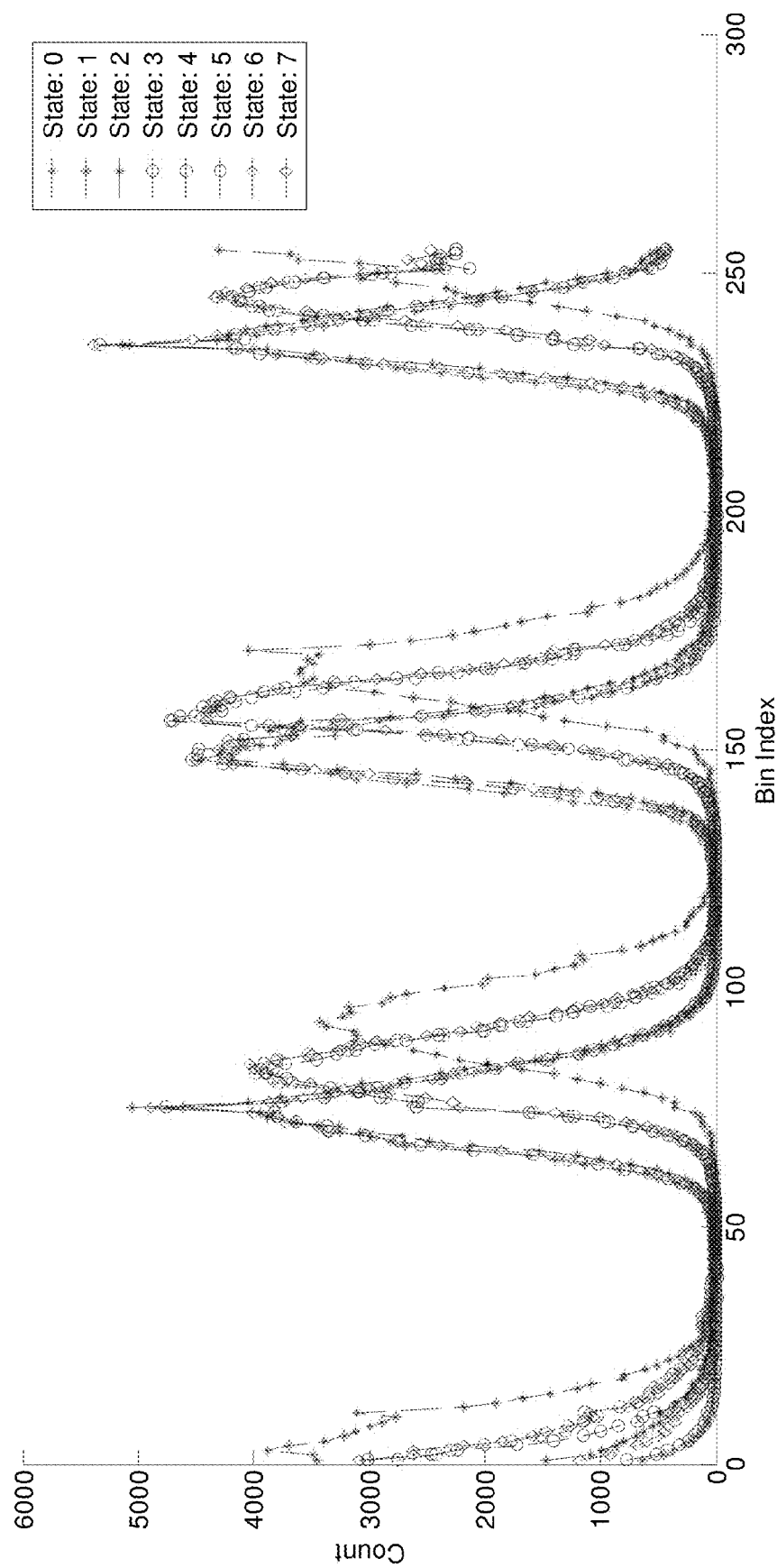
FIG. 8 shows a histogram of bin index according to the present disclosure.

In FIG. 8, a histogram for a memory device having memory cells capable of storing 3-bits-per-cell is shown. Each cell can have one of eight possible states. Note that instead of a single overall distribution, three distinct threshold voltage distributions can be observed. Also, eight separate distributions corresponding to eight separate states are not observed since cells having some of the states cause similar inter-cell interference.

For example, cells having states 1, 3, 5, and 7 cause similar inter-cell interference; cells having states 0, 4, and 6 cause similar inter-cell interference; and cells having state 2 cause similar inter-cell interference. Accordingly, while the cells can have eight possible states, only three threshold voltage distributions cause inter-cell interference.

The inter-cell interference pattern is device-dependent. That is, the inter-cell interference pattern observed for a memory device is the same for all units of the memory device manufactured using the same process. Further, the inter-cell interference pattern (i.e., a pattern of aggressor cells causing inter-cell interference to victim cells) does not change throughout the life of the memory device although the memory device ages due to usage. The inter-cell interference pattern of a memory device is therefore a signature characteristic of the memory device.

The inter-cell interference pattern of a memory device is based on the programming sequence or order of programming pages that is optimized for the device by the memory device manufacturer. Accordingly, for a memory device, the inter-cell interference pattern can be studied by selecting a victim cell and analyzing impact of one or more aggressor cells. The aggressor cells may be located along the same bit line and/or the same word line as the victim cell. Alternatively or additionally, the aggressor cells may be located along an adjacent word line and/or bit line.

Figure 9A:
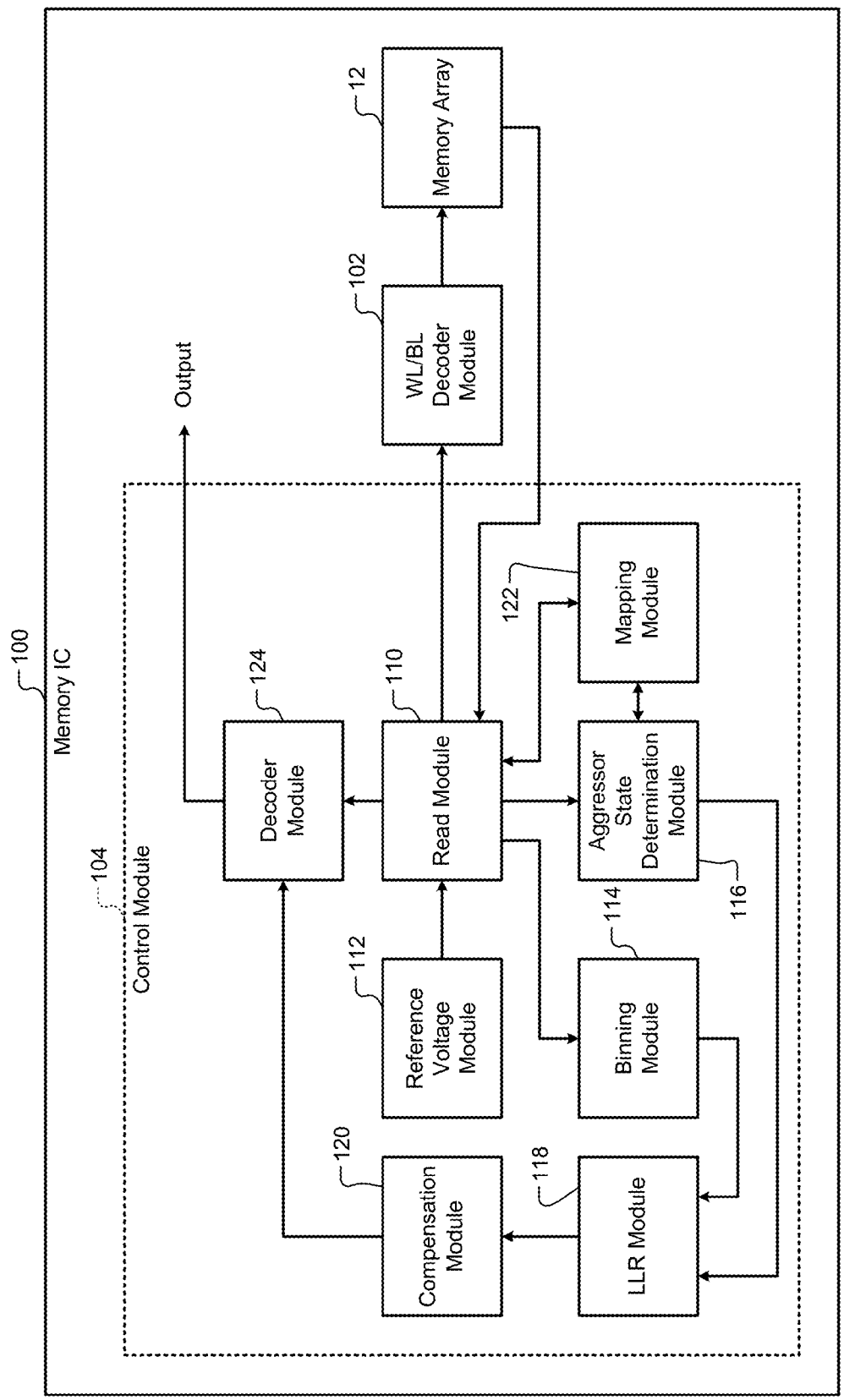
FIG. 9A is a functional block diagram of a memory integrated circuit (IC) including a control module for compensating inter-cell interference according to the present disclosure.
Figures 9B, 13:
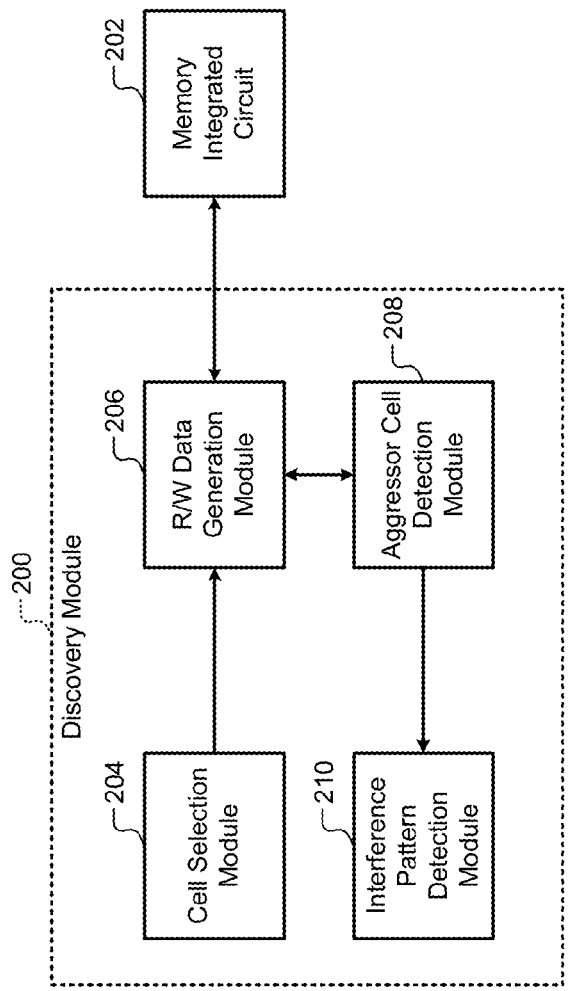
FIG. 9B shows layout of memory for storing soft information and aggressor state information according to the present disclosure.
FIG. 13 is a functional block diagram of a system including a discovery module that discovers an inter-cell interference pattern of a memory IC according to the present disclosure.

In FIGS. 9A and 9B, a memory integrated circuit (IC) 100 detects and compensates inter-cell interference according to the present disclosure as follows. In FIG. 9A, the memory IC 100 includes the memory array 12, a WL/BL decoder module 102, and a control module 104. The control module 104 includes a read module 110, a reference voltage module 112, a binning module 114, an aggressor state determination module 116, an LLR module 118, a compensation module 120, a mapping module 122, and a decoder module 124.

The read module 110 reads states of memory cells selected by the WL/BL decoder module 102 in the memory array 12. The reference voltage module 112 generates reference voltages to read the memory cells. The binning module 114 divides threshold voltage distributions of the memory cells into a plurality of bins based on the reference voltages used to read the memory cells. The binning module 114 generates a bin index for each memory cell based on read operations performed on the memory cells using the reference voltages.

The aggressor state determination module 116 determines states of aggressor cells that affect a victim cell and determines a combined state called an aggressor state for the aggressor cells that affect the victim cell as explained below. The LLR module 118 generates an LLR based on a combination of the bin index and the aggressor state for each memory cell. The compensation module 120 compensates (cancels) the inter-cell interference based on the LLRs. The mapping module 122 maps the aggressor states to threshold voltage distributions of the aggressor cells to optimize the aggressor state information as explained below. In use, the decoder module 124 decodes data read from the memory array 12 after the inter-cell interference is compensated in case of an error.

The operations of these modules are now explained in detail. As mentioned above, to account for inter-cell interference, the bin index should also reflect the states of the neighboring cells. The cell for which an LLR is computed is called a victim cell. The neighboring cells that cause inter-cell interference to the victim cell are called aggressor cells. An aggressor state is generated as follows.

Suppose, in a 2-bits-per-cell memory device for example, a victim cell is affected by two aggressor cells, each of which can have one of four possible states. In this example, the two aggressor cells can have a total of 16 states, and four bits of memory will be necessary to store a combined state of the two aggressor cells. The combined state of the two aggressor cells is called the aggressor state.

In the example shown in FIG. 8, while a total of eight possible states can have eight corresponding threshold voltage distributions, only three of the eight distributions cause inter-cell interference since some states do not cause interference and some states cause similar interferences. Accordingly, only three distributions need to be considered for inter-cell interference purposes.

Similarly, while there are 16 possible states for the two aggressor cells, some of the 16 possible states will not cause inter-cell interference, and some of the 16 possible states will cause similar interferences. Accordingly, the total number of distributions that will cause inter-cell interference will be less than 16. Therefore, less than four bits will be necessary to store the aggressor state of the two aggressor cells.

In FIG. 9B, an example of generating and storing soft information (bin index information) and aggressor state information for a victim cell is shown. The read module 110 reads a page of memory cells multiple times using multiple reference voltages, where the page includes victim cells (and possibly aggressor cells). Based on the multiple read operations, the binning module 114 generates soft information (bin index information) for each victim cell and stores the soft information in a first set of six bits (bit zero through bit five) for each victim cell.

The read module 110 reads one or more adjacent pages of memory cells, where the adjacent pages include the aggressor cells for the victim cells. Additionally, the read module 110 may also read the page that includes the victim cells if the page that includes the victim cells also includes aggressor cells. The aggressor state determination module 116 determines the states of the aggressor cells, generates the aggressor states, and stores the aggressor state information for each victim cell in a second set of six bits (bit six through bit 11). Accordingly, bits 0 to 11 form a metric that includes the soft information and the aggressor state information for the victim cell and that indicates inter-cell interference caused by the aggressor cells to the victim cell. Based on the metric, the LLR module 118 can generate LLRs to cancel the inter-cell interference caused by the aggressor cells to the victim cell.

While the first set of six bits indicates a location of the threshold voltage distribution of the victim cell, the second set of six bits indicates a number of distributions of the aggressor cells (for example, 3 distributions shown in FIG. 8), causing inter-cell interference to the victim cell. The read module 110 distinguishes the read operations performed to generate soft information from the read operations performed to generate aggressor state information. For example, a bit in a descriptor field can be used to distinguish the read operations. Accordingly, data obtained from read operations can be routed to update information stored in appropriate memory locations. Other ways can be used to distinguish the read operations.

The aggressor cells can be parameterized by word line number and bit line number of the aggressor cells. Specifically, for each victim cell, locations of corresponding aggressor cells can be specified in terms of offsets of word line numbers and bit line numbers. For example, in FIG. 7A, if a victim cell is located at word line i and bit line j, aggressor cells may be located at word line i+1 and bit line j−1, word line i and bit line j−1, and/or word line i+1 and bit line j. The parameters or offsets provide a spatial indication of where the aggressor cells are located with respect to a victim cell.

Accordingly, an inter-cell interference pattern for a memory device can be specified in terms of offsets of word line numbers and bit line numbers of victim cells and corresponding aggressor cells. The read module 110 utilizes the inter-cell interference pattern to perform read operations and includes the offset information in the data generated from each read operation so that the soft information and aggressor state information can be properly updated.

For example, for a victim cell on bit line j, the aggressor cell can be on bit line j+k, where k is any integer. Accordingly, data from each read operation should include the value of k. For example, let the aggressor cell be at word line i+1 and bit line j+1. In this case, when a page in word line i+1 is read, a descriptor is programmed to indicate that data from the read operation includes aggressor state information with k=1. So the value for bit line m in a new read should go into the bin index memory for bit line m−1. Another aggressor cell can be at word line i+2 and bit line j−1. In this case, when a page in word line i+2 is read, the descriptor is programmed to indicate that data from the read operation includes aggressor state information with k=−1. In this case, the value for bit line m in the new read should go into the bin index memory for bit line m+1.

After all of the soft information and the aggressor state information is obtained, the LLR module 118 generates an LLRs for each cell based on the soft information and the aggressor state information obtained. During normal operation, when a page read by the read module 110 has an error due to inter-cell interference, the compensation module 120 corrects the error based on the LLRs of the cells in the page.

Specifically, the LLR module 118 generates the LLRs in the form of a set of tables, one table for each possible aggressor state. If k bits are needed to store the aggressor state, $2^k$ tables would be needed to store the LLRs. This could drastically increase the amount of memory needed to store the LLRs and the amount of time needed to program the tables. As explained above with reference to FIG. 8, however, if there are a total of $2^k$ aggressor states, effects of some of the states will be similar, and in general, some states can be grouped into one state. A group of states of an aggressor cell having similar inter-cell interference effect on a victim cell is called a distribution.

For example, in FIG. 8, while an aggressor cell can have a total of eight states, only three distributions, each of which includes a group of states, affects a victim cell, and will therefore result in three LLR tables instead of eight LLR tables. Accordingly, the total number of tables will be equal to the number of distributions rather than the number of states. The tables provide LLRs, which are integers. For a bin index value for a victim cell, and for an aggressor state of the aggressor cells corresponding to the victim cell, a table provides an LLR value.

Figure 10:
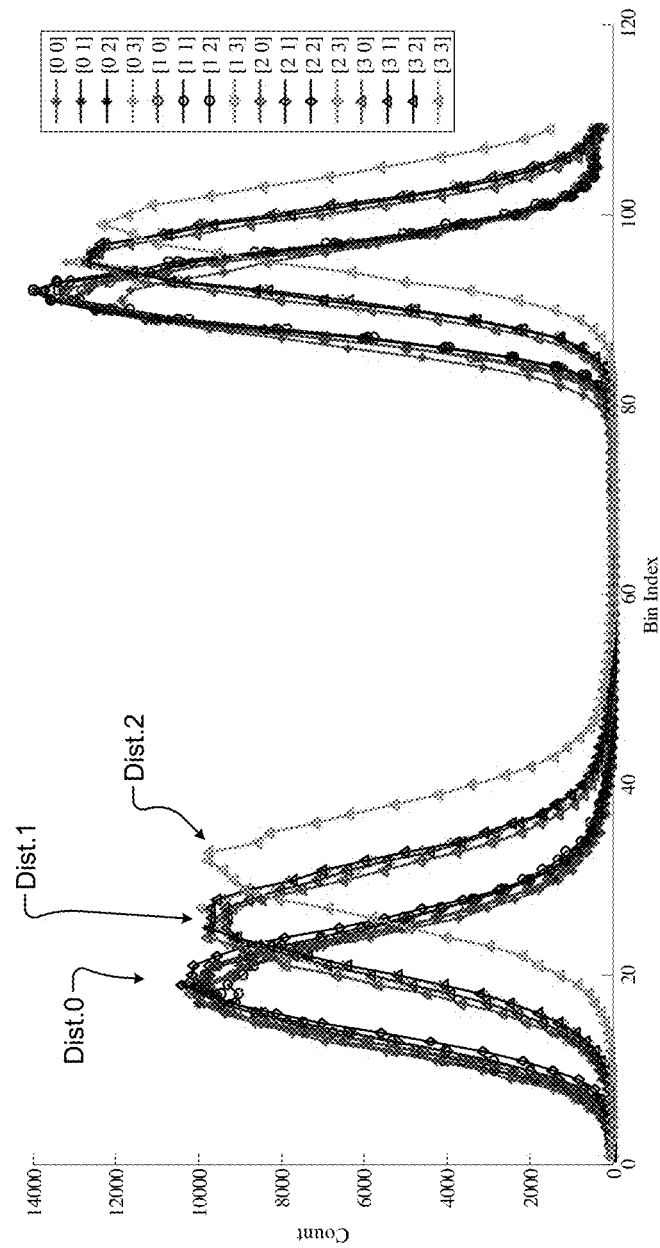
FIG. 10 is a histogram of bin index according to the present disclosure.

In FIG. 10, the concept of LLR tables is explained. For example only, consider a 2-bit-per-cell memory device. Suppose that the victim cell is located at word line i and bit line j, which is indicated by (i, j). Suppose further that two aggressor cells causing inter-cell interference to the victim cell are located at (i, j−1) and (i, j+1). The two aggressor cells can have a total of 16 possible states.

Depending on the inter-cell interference caused by the 16 states, the 16 possible states can be grouped into three distributions, where states grouped into one distribution cause similar inter-cell interference: distribution 0, distribution 1, and distribution 2. Suppose the four states of each 2-bit-per-cell are denoted by 0, 1, 2, and 3.

Distribution 0 corresponds to or represents threshold voltage distributions of nine of the 16 states: [0,0], [0,1], [0,2], [1,0], [1,1], [1,2], [2,0], [2,1], and [2,2]. Distribution 1 corresponds to or represents threshold voltage distributions of six of the 16 states: [3,0], [3,1], [3,2], [0,3], [1,3], and [2,3], where at least one aggressor cell is programmed to the highest state 3. Distribution 2 corresponds to or represents threshold voltage distribution of one of the 16 states: [3,3], where both aggressor cells are programmed to the highest state 3.

To store a state such as [x,y], four bits are needed. However, 16 different tables are not necessary for the four bits since the tables for some of the states that cause similar inter-cell interference will be the same. For example, the table for the states [0,0] and [2,0] will be the same since the inter-cell interference caused by these states have the same threshold voltage distribution.

Therefore, the mapping module 122 maps the aggressor states to distribution numbers. For example, in the example shown in FIG. 10, the mapping module 122 maps the nine aggressor states corresponding to distribution 0 to the distribution number 0, the six states corresponding to distribution 1 to the distribution number 1, and the one state corresponding to distribution 2 to the distribution number 2.

Accordingly, four bits of aggressor state information is compressed to two bits, which are required to store a distribution number 0, 1, or 2. The number of tables is reduced to the number of distribution numbers (e.g., three tables for three distributions instead of 16 tables for 16 states in the example shown in FIG. 10). The LLR module 118 generates one LLR table for each distribution number.

In FIG. 9B, for example, the distribution numbers are written in the aggressor state memory starting from bit 6. Accordingly, in one example, to store eight distribution numbers, only bits 6, 7, and 8 may be necessary. This will save memory since bits 9, 10, and 11, which would otherwise be necessary to store larger aggressor state information, will not be required to store fewer distribution numbers.

In FIG. 11, an example of a 2-bit-per-cell device shows the difference between the amount of memory required to store aggressor state information before mapping and the amount of memory required to store distribution numbers after mapping. Before mapping aggressor states to distribution numbers, bits 6 and 7 contain state of aggressor cell (i,j−1), and bits 8 and 9 contain state of aggressor cell (i,j+1). After mapping aggressor states to distribution numbers, bits 6 and 7 contain the distribution numbers.

In FIGS. 12A and 12B, the mapping module 122 can compress the mapping information to free up more bits in the aggressor state memory to enable reading more aggressor cells (e.g., in future devices). Since the number of aggressor states can be much more than the number of distributions, the aggressor state to distribution number lookup table can be large.

For example, if the aggressor state is determined by 9 bits and total number of distributions is 8, the lookup table will have 512 entries. Moreover, if aggressor state memory is only 6 bits, this aggressor pattern cannot be supported unless mapping information can be compressed as follows. The aggressor state to distribution number mapping can be performed in multiple steps to support this case.

In FIG. 12A, for example only, again consider a 2-bit-per-cell memory device in which aggressor state is determined by 4 bits but there are only 3 distributions (this is for illustration purposes only—in practice, the aggressor state may be determined by 9 bits). Now assume that we have only 3 bits for aggressor state memory. The mapping can be achieved in the following two steps.

In the first step, the read module 110 reads the state of aggressor cell (i,j−1) and it is stored in bits 6 and 7. At this point, a mapping from aggressor state to distribution number is performed according to the table shown in FIG. 12A. The distribution number is now contained in bit 6.

In FIG. 12B, in step 2, the read module 110 reads the aggressor cell (i,j+1) and stores the state in bits 7 and 8. Another mapping from aggressor state to distribution number is performed using the table shown in FIG. 12B. The distribution number is now contained in bits 6 and 7.

In use, for example, the inter-cell interference caused by aggressor cells, whose state information is compressed and stored in bits 7 and 6, on a victim cell, whose bin index is stored in the soft information memory (bits 0-5 shown in FIG. 9B), is canceled as follows. From bits 7 and 6, a table number of a LLR table (e.g., table corresponding to distribution number 0, 1, or 2 respectively denoted by 00, 01, or 10 in FIG. 12B) is obtained. Then an LLR entry in the LLR table corresponding to the bin index of the victim cell is obtained. The LLR is used to cancel the inter-cell interference caused by the aggressor cells on the victim cell.

For a memory device, the inter-cell interference pattern, which is a signature of the memory device, can be detected, and the LLR tables can then be generated based on the detected inter-cell interference pattern and provided to the manufacturer for incorporation into the memory device for interference cancellation. The discovery step, which includes detecting aggressor cells and their effect, is performed offline (once after the device is manufactured) as follows.

In FIG. 13, a discovery module 200 determines the inter-cell interference pattern of a memory integrated circuit 202. The discovery module 200 includes a cell selection module 204, a read/write data generation module 206, an aggressor cell detection module 208, and an interference pattern detection module 210. The cell selection module 204 selects a victim cell and selects neighboring cells to determine whether any of the neighboring cells are aggressor cells.

The read/write data generation module 206 writes all possible states in the victim cell and the aggressor cells and, for each state written to the victim cell and each aggressor cell, reads back data written to the victim cell. Based on the read/write operations, the aggressor cell detection module 208 detects aggressor cells for each victim cell by detecting which states of which neighboring cells cause inter-cell interference with the victim cell. Based on the detected aggressor cells, the interference pattern detection module 210 detects the interference pattern, which is a signature characteristic of the memory integrated circuit 202.

The outcome of the discovery step is a list of 3-tuples (a,b,c), where a is the offset in word line number, b is the offset in the bit line number, and c is the type of page in the aggressor word line. The reason for having c is that it is possible in some devices that the inter-cell interference is not dependent on some bit in a word line. For example, MSB (most significant bit) and CSB (center significant bit) could determine inter-cell interference and not LSB (least significant bit). Essentially, the discovery step generates a vector that indicates, for a given type of memory device, for a victim cell (i,j) which are the aggressor cells.

For example, in a 2-bit-per-cell memory device manufactured using a 24 nanometer process, a victim cell (i,j) is affected by aggressor cells (i,j−1), (i,j+1), and (i+2,j). Each aggressor cell has two bits. Accordingly, the output of the discovery step would include an inter-cell interference pattern, indicating locations of aggressor cells for each victim cell, and would be as follows.

Inter-cell interference of aggressor cell (i,j−1) on the victim cell (i,j) is: (0,−1,0), and (0,−1,1), where word line offset a=0, bit line offset b=−1, and c=0 and 1 since both bits of the aggressor cell (i,j−1) are causing interference.

Inter-cell interference of aggressor cell (i,j+1) on the victim cell (i,j) is: (0,1,0), and (0,1,1), where word line offset a=0, bit line offset b=1, and c=0 and 1 since both bits of the aggressor cell (i,j+1) are causing interference.

Inter-cell interference of aggressor cell (i+2,j) on the victim cell (i,j) is: (2,0,0), and (2,0,1), where word line offset a=2, bit line offset b=0, and c=0 and 1 since both bits of the aggressor cell (i+2,j) are causing interference.

For example, in a 3-bit-per-cell memory device manufactured using a 27 nanometer process, a victim cell (i,j) is affected by aggressor cell (i+1,j). The output of the discovery step would include an inter-cell interference pattern, indicating locations of aggressor cells for each victim cell, and would be as follows.

Inter-cell interference of aggressor cell (i+1,j) on the victim cell (i,j) is: (1,0,0), (1,0,0), and (1,0,2), where word line offset a=1, bit line offset b=0, and c=0, 1, and 2 since all three bits of the aggressor cell (i+1,j) are causing interference.

In the future, in a hypothetical 3-bit-per-cell memory device, a victim cell (i,j) may be affected by aggressor cells (i+1,j), (i+1,j−1), and (i+1,j+1). The output of the discovery step would include an inter-cell interference pattern, indicating locations of aggressor cells for each victim cell, and would be as follows.

Inter-cell interference of aggressor cell (i+1,j) on the victim cell (i,j) would be: (1,0,0), (1,0,1), and (1,0,2), where word line offset a=1, bit line offset b=0, and c=0, 1, and 2 since all three bits of the aggressor cell (i+1,j) would cause interference.

Inter-cell interference of aggressor cell (i+1,j−1) on the victim cell (i,j) would be: (1,−1,0), (1,−1,1), and (1,−1,2), where word line offset a=1, bit line offset b=−1, and c=0, 1, and 2 since all three bits of the aggressor cell (i+1,j−1) would cause interference.

Inter-cell interference of aggressor cell (i+1,j+1) on the victim cell (i,j) would be: (1,1,0), (1,1,1), and (1,1,2), where word line offset a=1, bit line offset b=1, and c=0, 1, and 2 since all three bits of the aggressor cell (i+1,j+1) would cause interference.

It can be seen that if the output of the discovery step is a list of size k, then k bits are needed to store the aggressor state information. If k>6, then multistep mapping explained above with reference to FIGS. 12A and 12B needs to be employed to compress the aggressor state information. The discovery step also consists of providing the intermediate aggressor state to distribution number mapping tables. The discovery step also provides information necessary to compute LLRs for different distributions.

Figure 14:
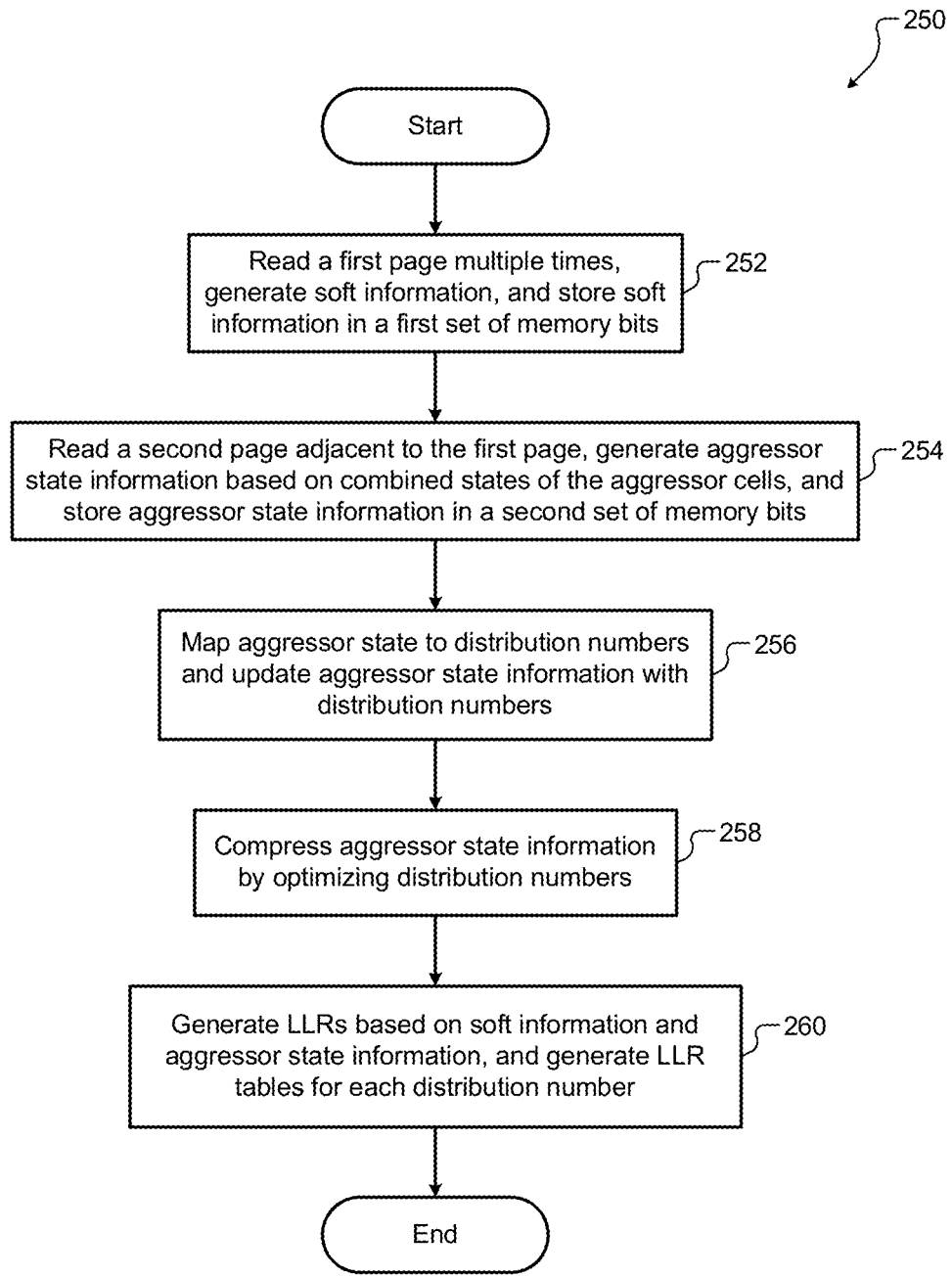
FIG. 14 shows a flowchart of a method for compensating inter-cell interference according to the present disclosure.

In FIG. 14, a method 250 for compensating inter-cell interference according to the present disclosure is shown. At 252, control reads a first page multiple times, generates soft information, and stores the soft information in a first set of memory bits. At 254, control reads a second page adjacent to the first page, generates the aggressor state information based on combined states of the aggressor cells, and stores the aggressor state information in a second set of memory bits.

At 256, control maps the aggressor state information to distribution numbers and updates the aggressor state information stored in the second set of bits with the distribution numbers. At 258, control compresses the aggressor state information, including the distribution numbers by optimizing the distribution numbers. At 260, control generates an LLRs based on the soft information and the aggressor state information and generates one LLR table per distribution number.

Figure 15:
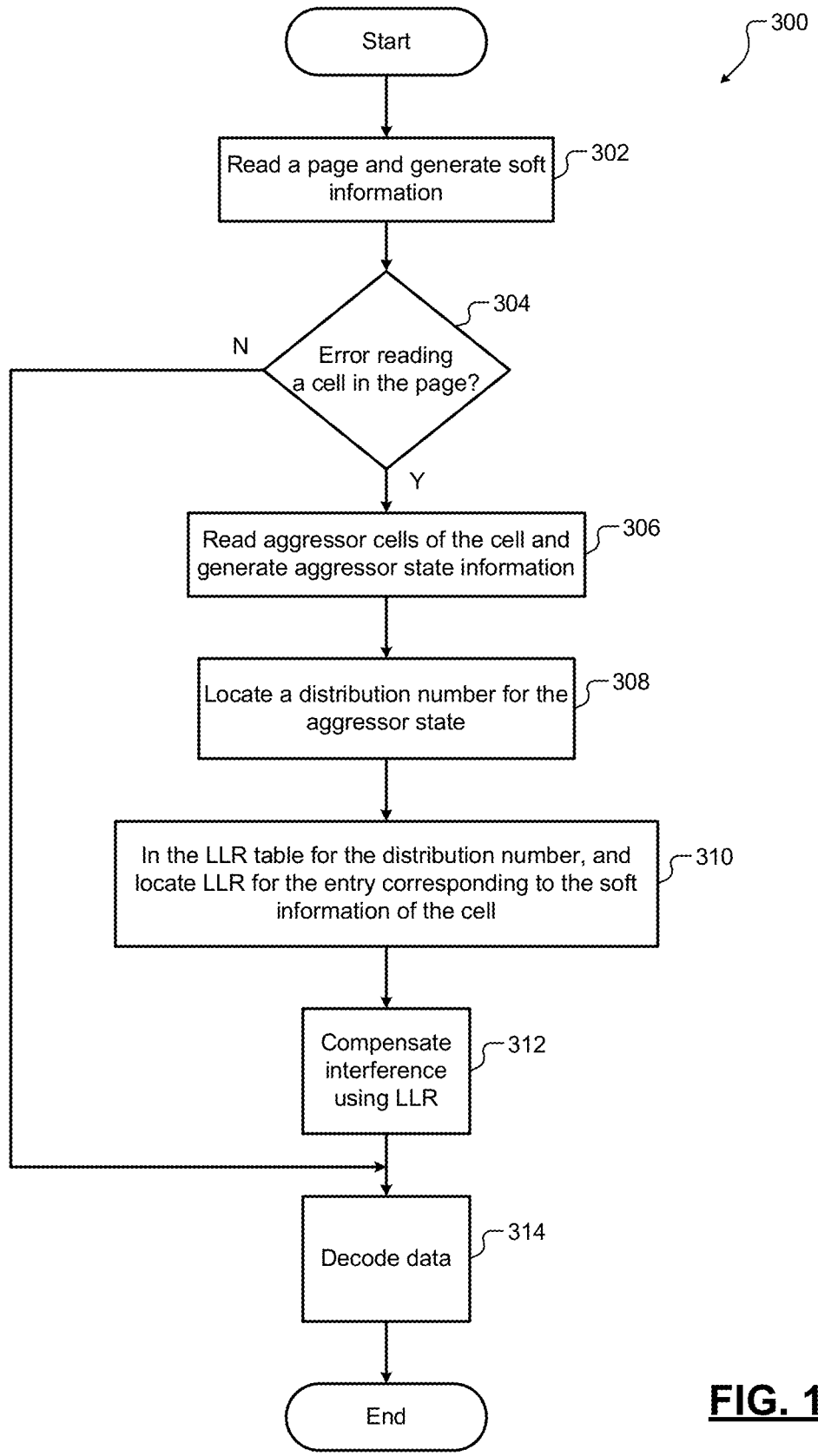
FIG. 15 shows a flowchart of a method for decoding data using inter-cell interference cancellation according to the present disclosure.

In FIG. 15, a method 300 for decoding data using inter-cell interference cancellation according to the present disclosure is shown. At 302, in use, control reads a page and generates soft information. At 304, control determines if an error occurred and reading a cell in the page. At 314, if no error occurs, control decodes data. At 306, if an error occurs, control reads aggressor cells corresponding to the cell and generates aggressor state information. At 308, control locates a distribution number for the aggressor state. At 310, in the LLR table for the distribution number, control locates an LLR for the entry corresponding to the soft information of the cell. At 312, control compensates interference using the LLR. At 314, control decodes the data in the page.

Figure 16:
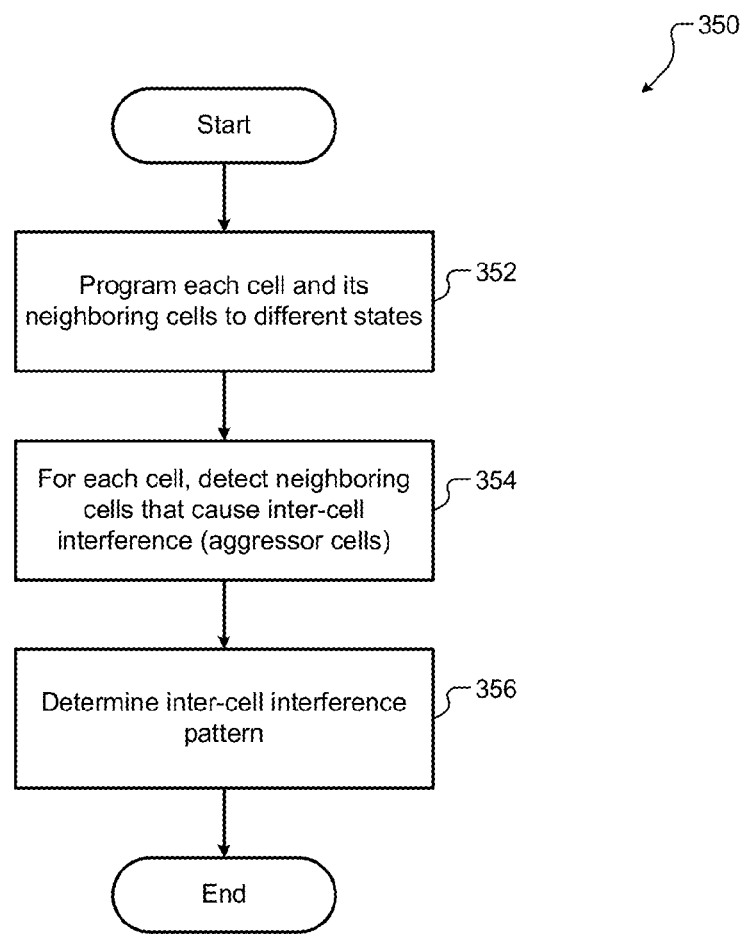
FIG. 16 shows a flowchart of a method for detecting a pattern of aggressor cells in a memory IC according to the present disclosure.

In FIG. 16, a method 350 for detecting a pattern of aggressor cells in the memory integrated circuit according to the present disclosure is shown. At 352, control programs each cell and its neighboring cells to different states. At 354, for each cell, control detects the neighboring cells that cause inter-cell interference (aggressor cells). At 356, control determines the inter-cell interference pattern for the memory integrated circuit.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A system comprising:
   a read module configured to
     read memory cells along a first word line of a memory array by applying a plurality of threshold voltages to the first word line;
     generate first information about a first memory cell located along the first word line and a first bit line of the memory array, the first information indicating a location of a threshold voltage distribution of the first memory cell relative to the plurality of threshold voltages;
     read a second memory cell located along (i) the first word line, (ii) a second word line near the first word line, or (iii) a second bit line near the first bit line; and
     generate second information about the second memory cell indicating a state of the second memory cell causing interference to the first memory cell; and
   a compensation module configured to compensate for the interference by assigning one or more of a log-likelihood ratio and a hard decision to the first memory cells based on (i) the first information and (ii) a distribution number inferred from the second information of the second memory cell causing the interference to the first memory cell.

2. The system of claim 1, wherein:
   one or more memory cells cause interference to the first memory cell; and
   the one or more memory cells includes the second memory cell.

3. The system of claim 1, further comprising:
   a state determination module configured to determine states of one or more memory cells causing interference to the first memory cell, the one or more memory cells including the second memory cell,
   wherein the one or more memory cells are located along (i) the first word line, (ii) the second word line, or (iii) the second bit line, and
   wherein locations of the one or more memory cells depend on a predetermined sequence of programming the memory cells.

4. The system of claim 3, further comprising:
   a mapping module configured to map one or more of the states causing similar interference to the distribution number,
   wherein the distribution number represents threshold voltage distributions of the one or more of the states causing the interference to the first memory cell.

5. The system of claim 4, further comprising:
   a log-likelihood ratio module configured to generate the log-likelihood ratio corresponding to (i) the first information and (ii) the distribution number,
   wherein the log-likelihood ratio is used to compensate for the interference to the first memory cell.

6. A method comprising:
   reading memory cells along a first word line of a memory array by applying a plurality of threshold voltages to the first word line;
   generating first information about a first memory cell located along the first word line and a first bit line of the memory array, the first information indicating a location of a threshold voltage distribution of the first memory cell relative to the plurality of threshold voltages;
   reading a second memory cell located along (i) the first word line, (ii) a second word line near the first word line, or (iii) a second bit line near the first bit line; and
   generating second information about the second memory cell indicating a state of the second memory cell causing interference to the first memory cell; and
   compensating for the interference by assigning one or more of a log-likelihood ratio and a hard decision to the first memory cells based on (i) the first information and (ii) a distribution number inferred from the second information of the second memory cell causing the interference to the first memory cell.

7. The method of claim 6, wherein:
   one or more memory cells cause interference to the first memory cell; and
   the one or more memory cells includes the second memory cell.

8. The method of claim 6, further comprising:
   determining states of one or more memory cells causing interference to the first memory cell, the one or more memory cells including the second memory cell,
   wherein the one or more memory cells are located along (i) the first word line, (ii) the second word line, or (iii) the second bit line, and
   wherein locations of the one or more memory cells depend on a predetermined sequence of programming the memory cells.

9. The method of claim 8, further comprising:
   mapping map one or more of the states causing similar interference to the distribution number,
   wherein the distribution number represents threshold voltage distributions of the one or more of the states causing the interference to the first memory cell.

10. The method of claim 9, further comprising:
    generating the log-likelihood ratio corresponding to (i) the first information and (ii) the distribution number,
    wherein the log-likelihood ratio is used to compensate for the interference to the first memory cell.

11. A system comprising:
    a read module configured to
      read memory cells along a first word line of a memory array by applying a plurality of threshold voltages to the first word line;
      generate first information about a first memory cell located along the first word line and a first bit line of the memory array, the first information indicating a location of a threshold voltage distribution of the first memory cell relative to the plurality of threshold voltages;
      read a second memory cell located along (i) the first word line, (ii) a second word line near the first word line, or (iii) a second bit line near the first bit line; and
      generate second information about the second memory cell indicating a state of the second memory cell causing interference to the first memory cell; and
    a compensation module configured to compensate for the interference by assigning one or more of a log-likelihood ratio and a hard decision to the first memory cells based on (i) the first information and (ii) the second information.

12. The system of claim 11, wherein the compensation module is configured to compensate for the interference by assigning the one or more of the log-likelihood ratio and the hard decision to the first memory cells based on (i) the first information and (ii) a distribution number inferred from the second information.

13. The system of claim 11, wherein:
one or more memory cells cause interference to the first memory cell; and
the one or more memory cells includes the second memory cell.

14. The system of claim 11, further comprising:
a state determination module configured to determine states of one or more memory cells causing interference to the first memory cell, the one or more memory cells including the second memory cell,
wherein the one or more memory cells are located along (i) the first word line, (ii) the second word line, or (iii) the second bit line, and
wherein locations of the one or more memory cells depend on a predetermined sequence of programming the memory cells.

15. The system of claim 14, further comprising:
a mapping module configured to map one or more of the states causing similar interference to a distribution number,
wherein the distribution number represents threshold voltage distributions of the one or more of the states causing the interference to the first memory cell.

16. The system of claim 15, further comprising:
a log-likelihood ratio module configured to generate the log-likelihood ratio corresponding to (i) the first information and (ii) the distribution number,
wherein the log-likelihood ratio is used to compensate for the interference to the first memory cell.

* * * * *